United States Patent
Rengarajan et al.

(10) Patent No.: US 6,960,818 B1
(45) Date of Patent: Nov. 1, 2005

(54) RECESSED SHALLOW TRENCH ISOLATION STRUCTURE NITRIDE LINER AND METHOD FOR MAKING SAME

(75) Inventors: Rajesh Rengarajan, Poughkeepsie, NY (US); Venkatachalam C. Jaiprakash, Beacon, NY (US)

(73) Assignee: Siemens Aktiengesellschaft, Munich (DE)

( * ) Notice: Subject to any disclaimer, the term of this patent is extended or adjusted under 35 U.S.C. 154(b) by 970 days.

(21) Appl. No.: 09/000,626

(22) Filed: Dec. 30, 1997

(51) Int. Cl.$^7$ ............................................. H01L 29/00
(52) U.S. Cl. ........................ 257/510; 257/511; 257/512; 257/513; 257/516
(58) Field of Search ................................ 257/510–513, 257/516, 300, 301, 640, 641, 647, 649; 438/227, 228, 424–427

(56) References Cited

U.S. PATENT DOCUMENTS

| | | | | |
|---|---|---|---|---|
| 5,061,653 A | * | 10/1991 | Teng | 438/426 |
| 5,248,894 A | * | 9/1993 | Beasom | 257/519 |
| 5,395,786 A | | 3/1995 | Hsu et al. | 437/52 |
| 5,436,488 A | * | 7/1995 | Poon et al. | 257/397 |
| 5,447,884 A | * | 9/1995 | Fahey et al. | 438/437 |
| 5,573,633 A | | 11/1996 | Gambino et al. | 156/636.1 |
| 5,604,159 A | | 2/1997 | Cooper et al. | 437/203 |
| 5,717,628 A | * | 2/1998 | Hammerl et al. | 257/300 |
| 5,763,315 A | * | 6/1998 | Benedict et al. | 438/424 |
| 5,872,045 A | * | 2/1999 | Lou et al. | 438/432 |
| 5,972,778 A | * | 10/1999 | Hamada | 438/444 |

FOREIGN PATENT DOCUMENTS

| | | | | |
|---|---|---|---|---|
| EP | 0 624 899 A2 | 11/1994 | | |
| JP | 57-159038 | * 10/1982 | | 438/228 |
| JP | 1-282836 | * 11/1989 | | 438/227 |

OTHER PUBLICATIONS

S Wolf, Silicon Processing for the VISI Era, vol. 2—Process Integration, pp. 45, 154 1990.*
Patent Abstracts of Japan—Pub. 03112148 dated May 13, 1991; Appcn. 01251301, dated Sep. 27, 1989.
Patent Abstracts of Japan—Pub. 03185856 dated Aug. 13, 1991; Applcn. 01326317, dated Dec. 15, 1989.
Patent Abstracts of Japan—Pub. 05021591 dated Jan. 29, 1993; Applcn. 03172028, dated Jul. 12, 1991.
Sze, S.M.; "Physics of Semiconductor Devices"; XP–002098820; 2$^{nd}$ Edition, John Wiley & Sons, New York; pp. 345–346.

* cited by examiner

*Primary Examiner*—Thien F Tran
(74) *Attorney, Agent, or Firm*—Edell, Shapiro & Finnan

(57) ABSTRACT

A method for reducing hot carrier reliability problems within an integrated circuit device. The method includes forming a shallow trench isolation structure incorporated with the device by filling a trench with a photoresist plug and removing a portion of the photoresist plug to a level below the depth of a channel also incorporated with the device. A nitride liner disposed within the trench under the photoresist plug is then recessed to a level substantially equal to the level of the photoresist material, which is then removed. The method further includes the deposition of oxide fill within the trench, thereby encapsulating the recessed nitride liner.

8 Claims, 6 Drawing Sheets

RECESSED SHALLOW TRENCH ISOLATION STRUCTURE NITRIDE LINER AND METHOD FOR MAKING SAME

BACKGROUND OF THE INVENTION

The present invention relates to the fabrication of semiconductor devices. More particularly, the present invention relates to the fabrication of a shallow trench isolation structure that advantageously reduces hot carrier reliability problems in the support circuit area of a dynamic random access memory (DRAM) while maintaining a high retention time in the array area of the DRAM.

Dynamic random access memory is known in the art. Generally speaking, a dynamic random access memory includes an array area which typically has transistors and capacitors. The capacitors are typically configured to store a charge which can be accessed by appropriate support circuitry associated with the DRAM. Typically, the array circuitry and the support circuitry of the DRAM are located in different areas of the integrated circuit (IC). Although transistors are present in both the array area and the support area of the DRAM, N-FETs (N-channel Field Effect Transistors) are typically employed in the array area, while P-FETs (P-channel Field Effect Transistors) are generally employed in the support circuitry area.

The transistors are typically implemented in wells which are created in the substrate of the integrated circuit die. These wells are separated, in some circuits, by shallow trench isolation structures. To facilitate discussion, FIG. 1 illustrates a shallow trench isolation structure 100 which is created in a silicon substrate 102. Above surface 10 of silicon substrate 102, a pad oxide layer 106 is deposited. Above pad oxide layer 106 is disposed a pad nitride layer 108. After pad oxide layer 106 and pad nitride layer 108 are deposited above surface 110 of silicon substrate 102, a photoresist layer (not shown) is then formed above pad nitride layer 108 to facilitate etching of trench 104. The etchant will etch through pad nitride layer 108, pad oxide layer 106 and into silicon substrate 102. The depth to which the trench is etched may vary with particular DRAM designs, however the trench depth is typically about 2000 to 3000 angstroms below the silicon surface. Thereafter, an active area oxide layer 112 is formed on the vertical surfaces of trench 104. After the formation of active area oxide layer 112, a nitride liner 114 is conformably deposited in trench 104 and above pad nitride layer 108.

In FIG. 2, an oxide fill 202, typically comprising tetraethylorthosilicate (TEOS), is deposited into trench 104 and planarized so that the top surface of oxide fill 202 lies substantially planar with the top surface of the nitride liner 114. Thereafter, the portion of nitride liner 114 lying above pad nitride layer 108, and pad nitride layer 108 are stripped away.

To completely strip away thick pad nitride layer 108, some overetching of the remaining portion of nitride liner 114 may occur, which causes the remaining portion of nitride liner 114 to be recessed inside trench 104. The recessed nitride liner 114 is shown in FIG. 3A in which pad nitride layer 108 has been stripped away and nitride liner 114 has been recessed so that the top surface of nitride liner 114 is now within trench 104. Consequently, the recess of nitride liner 114 creates a divot region 302 within the trench as shown. In one example such overetching may result in the recess of nitride liner 114, and therefore the divot region 302, having a depth of about 200 angstroms.

Thereafter, subsequent gate forming processes are performed in which, after planarizing the oxide fill 202, the gate oxide 304 and gate polysilicon 306 are deposited to form a transistor gate as shown in FIG. 3B. As is well known to those skilled in the art, some of the gate polysilicon material will be deposited into divot region 302 thereby wrapping around the silicon portions which are isolated by the STI.

It is difficult to control the depth of the divot region (shown in FIG. 3A as 302) created by the etch process employed to strip pad nitride layer 108. Since the gate polysilicon is subsequently deposited into this divot region, the variable depth of divot region 302 leads to a variable amount of polysilicon wrapped around the gate. This affects control of the threshold voltage of the gate to be formed, thereby degrading performance of the transistors (e.g., the N-FET transistors in the DRAM array area).

Although not shown in FIGS. 1–3, shallow trench isolation structure 100 is typically disposed beside a capacitor located in the array area of the DRAM. The capacitor typically extends below the substrate surface to a depth greater than approximately 5000 nanometers (nm). The capacitor typically includes an isolation oxide region, also know as a collar oxide, which typically extends to a depth of 1500 nm below the surface of the substrate. A portion of the bottom surface of the STI becomes juxtaposed with the collar oxide. Following the deposition of oxide fill 202, subsequent high temperature process steps, for example shallow trench TEOS fill densification, may be employed. The presence of nitride liner 114 helps prevent unwanted oxidation of the collar oxide of the capacitor during such high temperature steps. As is well known in the art, such unwanted oxidation causes dislocations in the silicon, thereby affecting the retention time, i.e., the ability of the capacitor in the array area to hold a charge.

However, the proximity of nitride liner 114 to the transistor channels disadvantageously exacerbates the hot carrier reliability problem for the P-FET transistors in the support circuitry. Hot carrier reliability problems are caused when nitride liner 114 traps or collects charge that should traverse the P-FET channels located near the shallow trench isolation structure. Such trapping or collecting may occur when a portion of nitride liner 114 lies at a depth less than the P-FET channel depth Dc as shown in FIG. 3A. By way of example, the recessed nitride liner overlaps the P-FET channel by about 800 angstroms in FIG. 3A. As can be appreciated by those skilled in the art, hot carrier reliability problems increase power consumption of the P-FET transistors and, in some cases, may lead to incorrect timing of the circuitry.

In view of the foregoing, there are desired improved shallow trench isolation structures which advantageously reduce hot carrier reliability problems in the support circuit area of a dynamic random access memory (DRAM) while maintaining a high retention time in the array area of the DRAM.

SUMMARY OF THE INVENTION

In one embodiment the invention relates to a shallow trench isolation structure of an integrated circuit on a substrate. The shallow trench isolation structure includes a trench in the substrate, and a nitride liner recessed within the trench. The nitride liner is recessed such that the uppermost part of the nitride liner is below the depth of a P-FET channel, where the depth of the P-FET channel represents the width of a P-FET transistor disposed in a well beside the shallow trench isolation structure.

The invention further relates, in another embodiment, to a method for reducing hot carrier reliability problems in an integrated circuit device on a substrate. In relation to this method of the invention, the device includes a channel and a shallow trench isolation structure having a trench in the substrate. Further, the trench has a nitride liner overlying an oxide layer within the trench. The method includes depositing a layer of photoresist material over the nitride liner in the trench, and recessing the photoresist material below the depth of the channel. The method further includes etching the nitride liner to a level substantially equal to the resist layer and then removing the remaining photoresist material. In addition, an oxide fill is deposited within the trench, encapsulating the nitride liner.

These and other features of the present invention will be described in more detail below in the detailed description of the invention and in conjunction with the following figures.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

The present invention will now be described in detail with reference to a few illustrative embodiments thereof as shown in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

The present invention relates to semiconductor integrated circuits (ICs) and, more particularly, to isolation structures used in the ICs. The ICs, for example, are memory circuits such as random access memories (RAMs), dynamic RAMs (DRAMs), synchronous DRAMs (SDRAMs), static RAMs (SRAMs), or read only memories (ROMs). Also, the ICs may be logic devices such as programmable logic arrays (PLAs), application specific ICs (ASICs), merged DRAM-logic ICs (embedded DRAMs), or any other circuit devices. The ICs chips are used in, for example, consumer electronic products such as computer systems, office equipment including copiers and printers, cellular phones, personal digital assistants (PDAs), and other electronic products.

In accordance with one embodiment of the present invention, there is provided an improved shallow trench isolation structure design which advantageously recesses the nitride liner to a depth below the channel depth. Since the nitride liner in the trench of the shallow trench isolation structure is recessed below the channel depth, little if any nitride liner material is present at the channel depth level to trap or collect charges that traverse the P-FET channel. In this manner, hot carrier reliability problems are advantageously minimized.

In accordance with another aspect of the present invention, the improved shallow trench isolation structure advantageously encapsulates the recessed nitride liner, thereby preventing the nitride liner from being exposed to the etch process employed to strip the pad nitride layer. Accordingly, the depth to which the nitride liner is recessed is more accurately controlled, which improves control of the threshold voltage of a subsequently formed gate.

Figure 1:
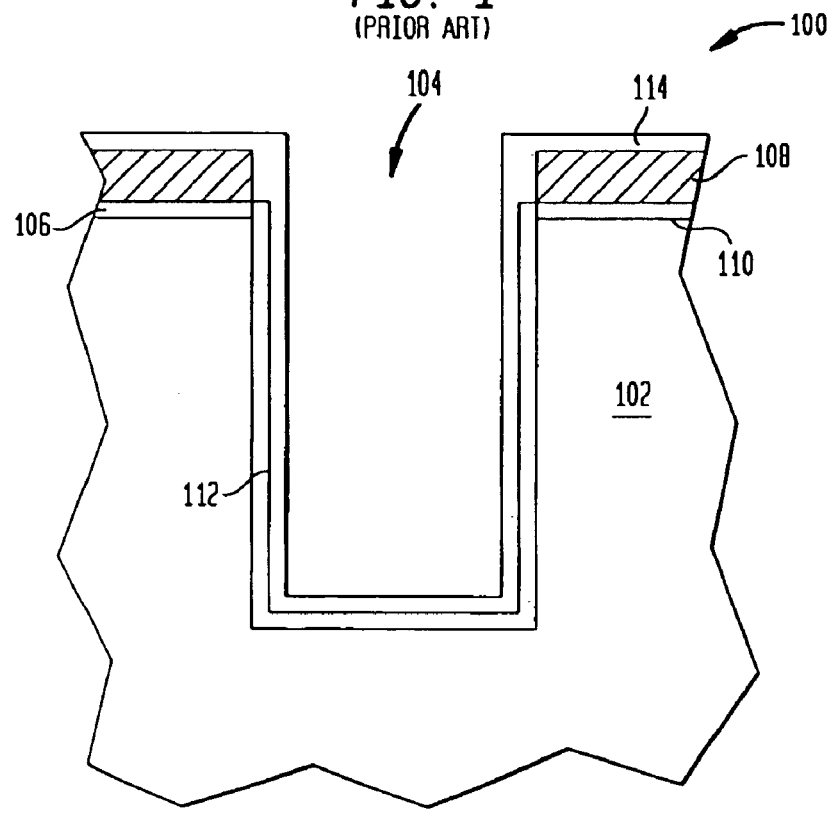
FIG. 1 is a cross-sectional view of a trench formed in a substrate in the proximity of capacitors (not shown) with overlying oxide and nitride layers, as well as a nitride liner.
Figure 2:
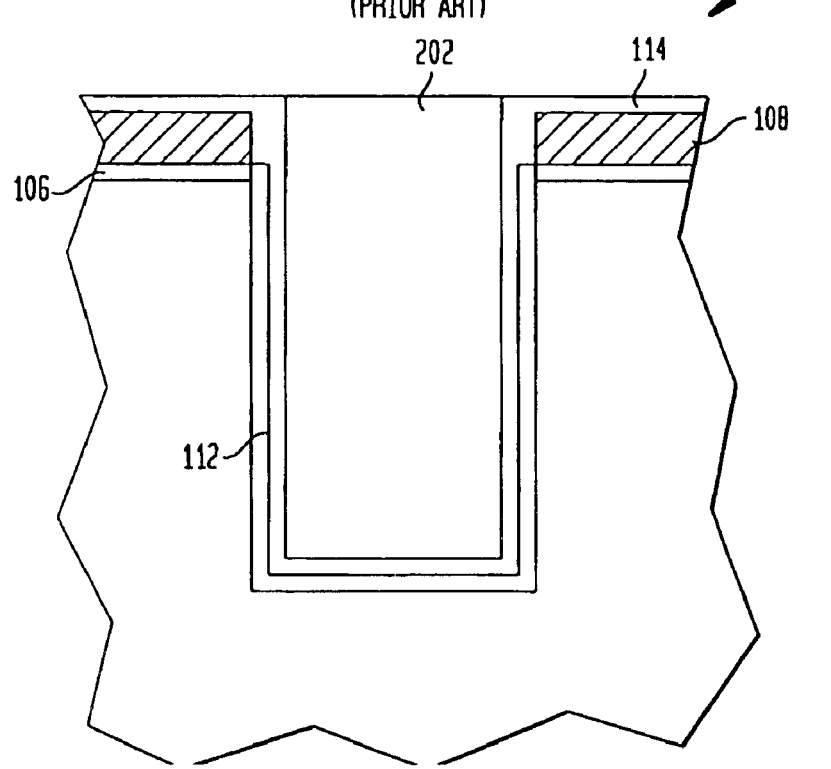
FIG. 2 is a cross-sectional view of the trench of FIG. 1, wherein oxide fill has filled the trench.
Figure 4:
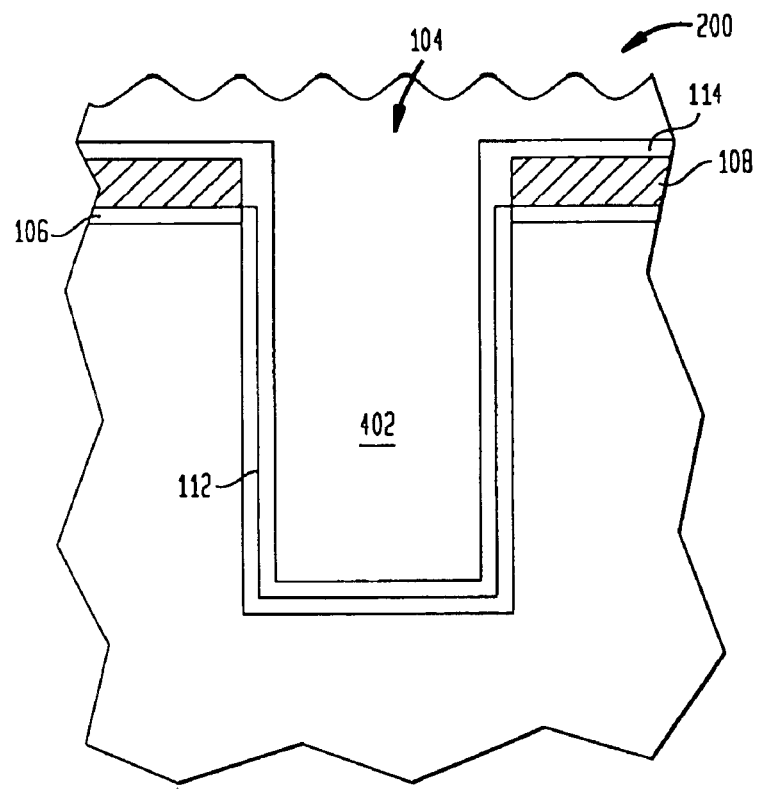
FIG. 4 is a cross-sectional view of a trench filled with photoresist material in accordance with one embodiment of the present invention.
Figure 5:
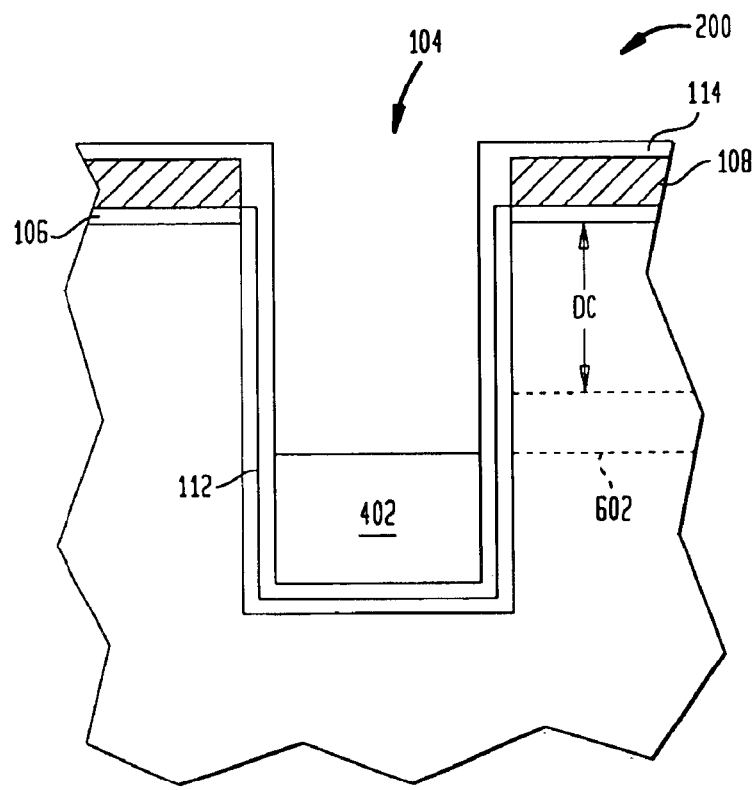
FIG. 5 is a cross-sectional view of the trench of FIG. 4, wherein the photoresist material has been recessed in accordance with one embodiment of the present invention.

To facilitate discussion of the features and advantages of the present invention, FIG. 4 illustrates improved shallow trench isolation structure 200, including a photoresist plug 402 disposed within trench 104 of shallow trench isolation structure 200, In contrast to the situation of FIG. 2 in which trench 104 is filled with oxide fill 202 after the nitride etch step, the process of FIG. 4 first fills trench 104 with a photoresist material, thereby forming photoresist plug 402. Thereafter, photoresist plug 402 is recessed within trench 104 to a specific predefined depth below the substrate surface as shown in FIG. 5. Preferably, this specific predefined depth is greater than the depth Dc of the channel of the P-FET transistor to be subsequently formed beside shallow trench isolation structure 200. Channel depth Dc is typically about 1000 angstroms, and thus the photoresist plug is preferably recessed to a depth greater than about 1000 angstroms. Recessing of the resist can be accomplished in several ways. Dry etching techniques in conventional and downstream plasma etch reactors can be used to control etch depth of the resist, thereby defining the resist recess, with downstream plasma etching being a preferred process. Several gas mixtures known to those skilled in the art may be used, however, typically gas mixtures such as $CF_4/O_2$ are used. Also, since resist is photosensitive and develops with exposure to light, controlled exposure to light can be used to define the depth of developed resist, thus defining the depth of the resist recess.

Figure 6:
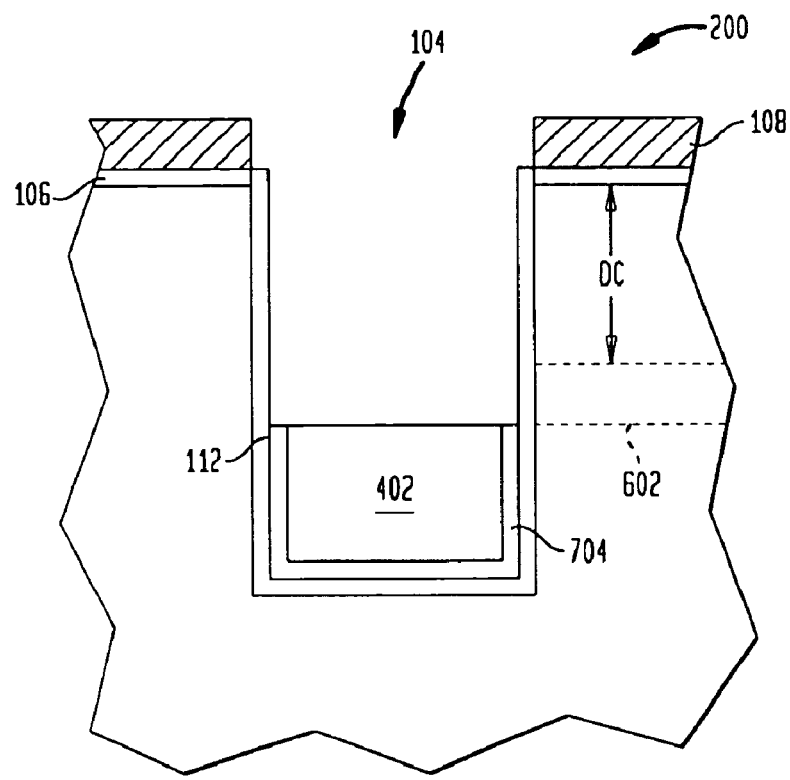
FIG. 6 is a cross-sectional view of the trench of FIG. 5, wherein the nitride liner has been recessed to a depth substantially equal to the depth of the photoresist material in accordance with one embodiment of the present invention.

Thereafter, a nitride liner etch process is employed to remove the portion of nitride liner 114 above pad nitride 108, and recess the portion of nitride liner 114 within trench 104 substantially to the depth of the previously recessed photoresist plug 402 to form recessed nitride liner 704. With reference to FIG. 6, recessed nitride liner 704 is recessed to the depth depicted by dash line 602, which also is preferably below the depth Dc of the channel (and thus greater than about 1000 angstroms in one example). However, the top of the recessed nitride liner 704 may be higher or lower than the depth of the previously recessed photoresist plug 402 if desired (as long as the liner top is below the channel depth Dc).

In one embodiment, nitride liner 114 of FIG. 5 is etched using a hot phosphoric acid. Alternatively, HF-Glycerol etch may be employed as well. Dry etching techniques such as downstream plasma etch reactors can also be used, given that the selectivity of this process to oxide is typically high. Between FIG. 6 and a subsequently shown FIG. 7, the recessed photoresist plug is removed using a conventional photoresist strip process. Preferably, the photoresist can be stripped in an oxygen plasma where the resist is chemically oxidized, but other suitable processes can be employed.

Figure 7:
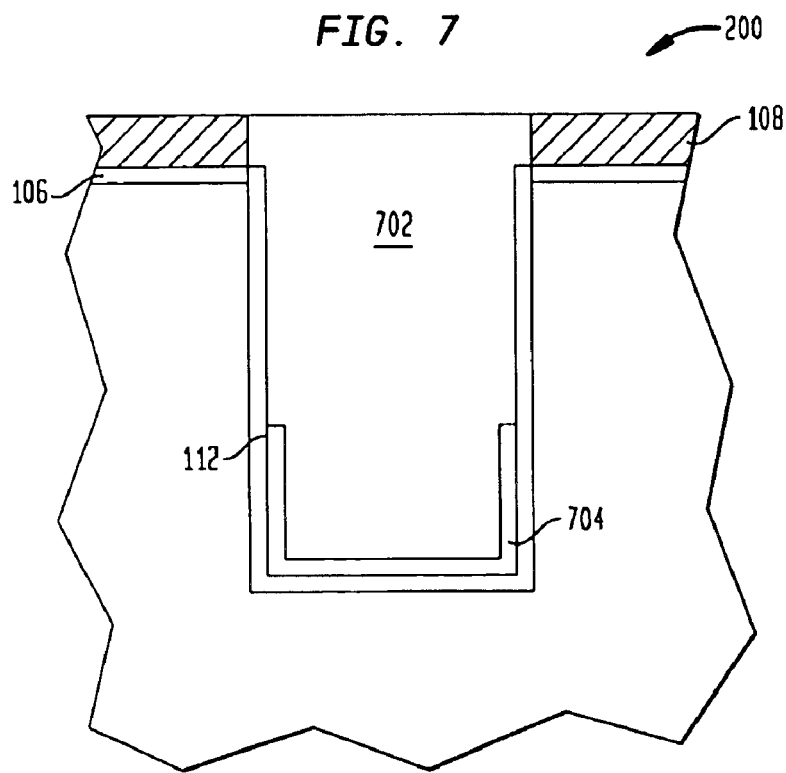
FIG. 7 is a cross-sectional view of the trench of FIG. 6, wherein an oxide fill has been deposited within the trench and planarized in accordance with one embodiment of the present invention.

In FIG. 7, oxide fill 702 is deposited into the trench previously occupied by the photoresist plug 402 and encapsulates the recessed nitride liner 704, thereby protecting recessed nitride liner 704 from a subsequently performed pad nitride strip process. As will be discussed in detail later, the encapsulation of recessed nitride liner 704 advantageously prevents the formation of a divot region during pad nitride strip and deposition of the gate polysilicon material around the edge of the trench 104, and thus reduces impact on the control of the threshold voltage for the subsequently formed gate. Although in the preferred embodiment oxide fill 702 is formed of any insulator based on silicon dioxide, such as TEOS, oxide fill 702 may alternatively be formed of any suitable dielectric material. Further, oxide fill 702 may be deposited by any conventional deposition process including, for example, chemical vapor deposition (CVD), low pressure CVD (LPCVD), sub-atmospheric CVD (SACVD) and plasma enhanced CVD (PECVD) techniques utilizing low or high density plasma sources.

Figure 3A:
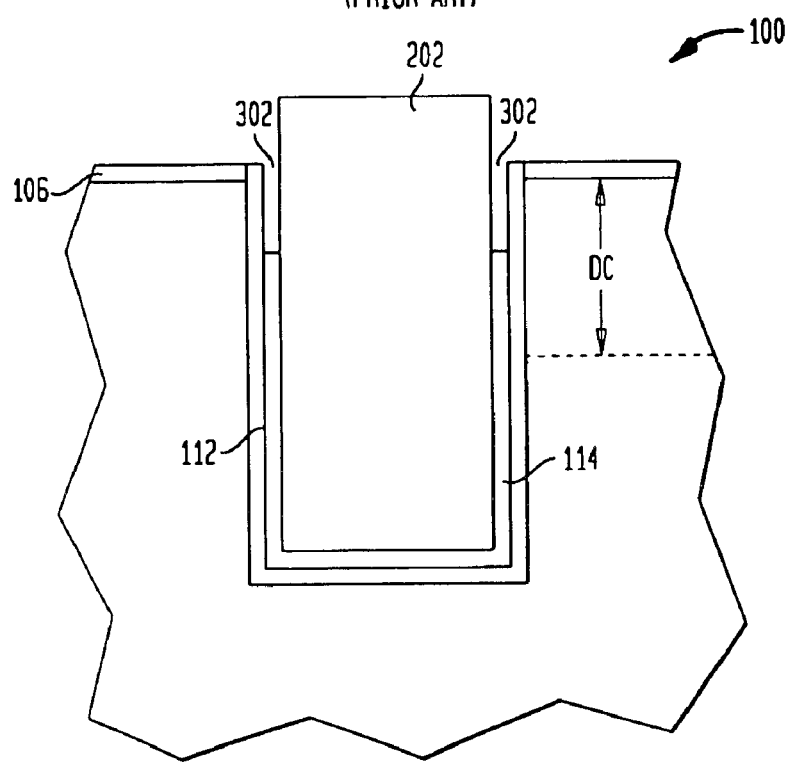
FIG. 3A is a cross-sectional view of the trench of FIG. 2, wherein the oxide and nitride layers have been removed and the nitride liner has been recessed within the trench resulting in the formation of divots.
Figure 3B:
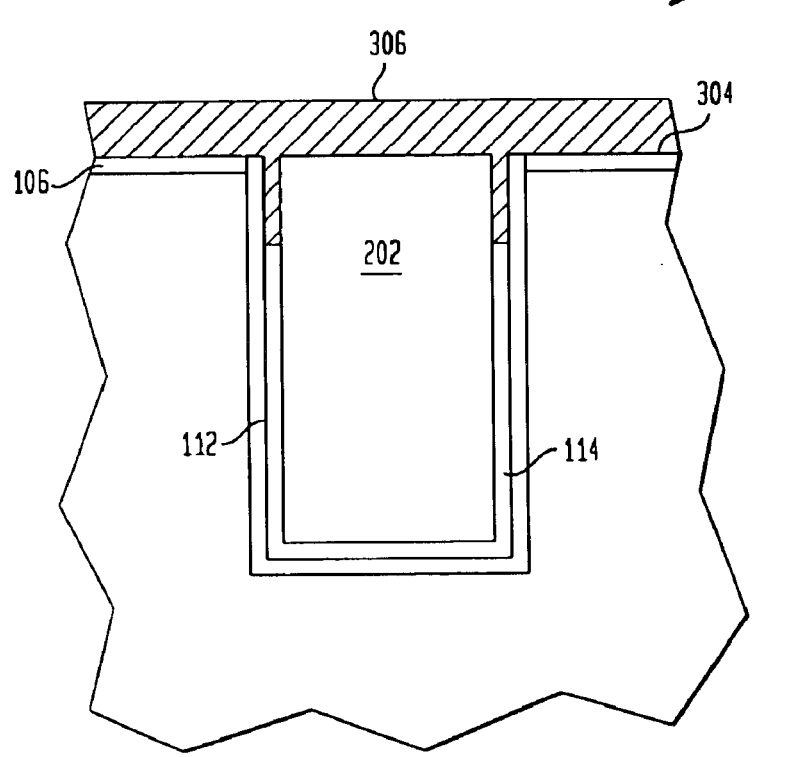
FIG. 3B is a cross-sectional view of the trench of FIG. 3A, wherein gate polysilicon has ben deposited above the trench, filling the divot region.
Figure 8:
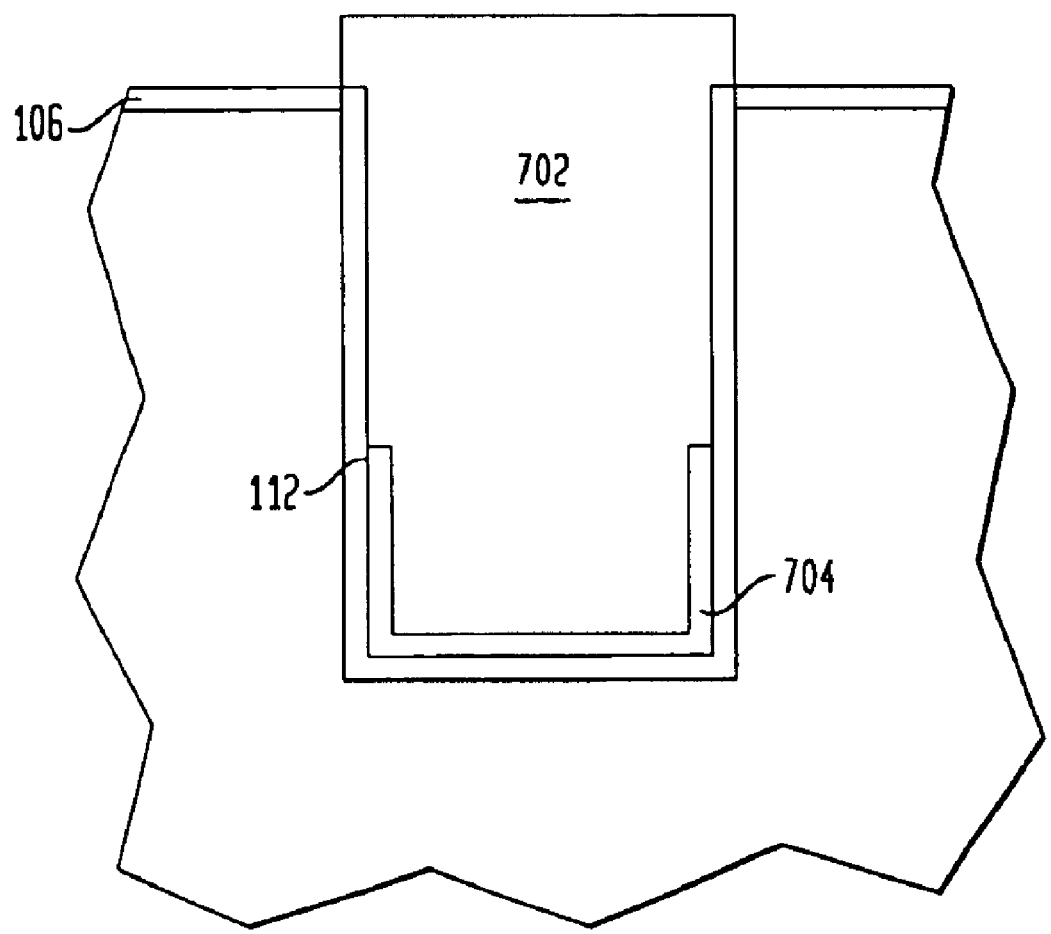
FIG. 8 is a cross-sectional view of the trench of FIG. 7, wherein the nitride layer has been removed in accordance with one embodiment of the present invention.

In FIG. 8, a pad nitride strip process is employed to remove pad nitride layer 108 of FIG. 7. As can be seen in FIG. 8, no divot region is formed out of the recessed nitride liner 704 (as was done in FIG. 3A). Without the divot region, no subsequently deposited polysilicon gate material is present between oxide fill 702 and either pad oxide layer 106 or active area oxide layer 112. After the pad nitride layer is removed, oxide fill 702 is planarized. Thereafter, additional conventional processing steps may be employed to complete the formation of shallow trench isolation structure 200 as well as the fabrication of the DRAM.

Figure 9:
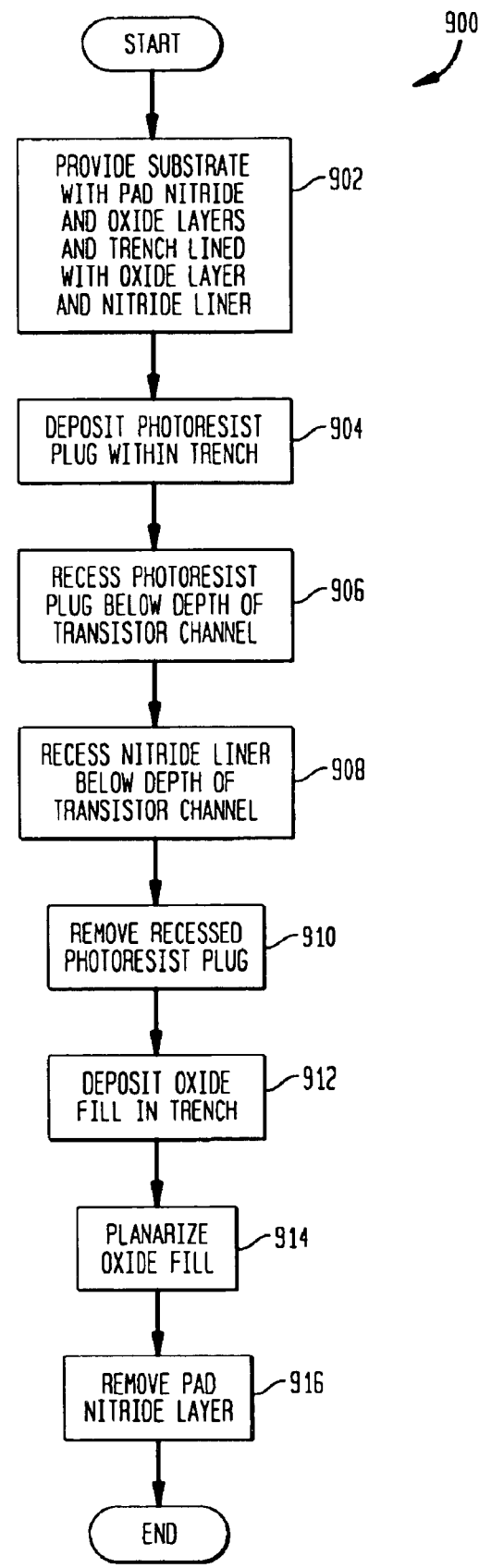
FIG. 9 is a flowchart of a process used to form the shallow trench isolation structure in accordance with one embodiment of the present invention.

The process 900 used to form the shallow trench isolation structure in accordance with one embodiment of the present invention is depicted in the flowchart of FIG. 9. A substrate having a trench lined with an active area oxide layer and further having a pad oxide layer and pad nitride layer disposed above the substrate surface in addition to a nitride liner disposed within the trench and across the substrate surface is provided in step 902. In steps 904 and 906 a photoresist plug is deposited within the trench and above the nitride liner, and then recessed to a depth greater than the channel depth of the P-FET. In step 908 the nitride liner is recessed to a depth within the trench The recessing of the nitride liner in step 908 results in the uppermost portion of the nitride liner falling below the channel depth of the P-FET.

The recessed photoresist plug is then removed in step 910. In step 912, an oxide fill is deposited within the STI trench including the area formerly filled with the photoresist plug. The oxide fill is deposited such that the recessed nitride liner is completely encapsulated by the oxide fill. Although the oxide fill is preferably comprised of TEOS, any suitable oxide fill material known to those with ordinary skill in the art can be used. After the oxide fill is planarized in step 914, the pad nitride layer is removed in step 916. The removal of the pad nitride layer can be accomplished using conventional methods such as dry etch methods known in the art. Thereafter, conventional post processing may be performed to construct integrated circuit devices such as a DRAM. Such devices may then be incorporated into both commercial and non-commercial electronic products, including computers.

As can be appreciated from the foregoing, the invention advantageously recesses the nitride liner within the shallow trench isolation structure to a depth below the channel depth of the P-FET transistor (the P-FET transistor channel depth is depicted in FIG. 8 by depth Dc). Advantageously, the recessed liner 704 no longer traps or collects charges that traverse the channel of the P-FET transistor. As can be appreciated by those skilled in the art, this advantageously minimizes hot carrier reliability problems, thereby preventing excessive power consumption and/or incorrect timing of the resulting circuitry.

Furthermore, the absence of a divot region after the pad nitride removal step, advantageously prevents polysilicon from being deposited into the divot region, thereby preventing the presence of the gate polysilicon material in the difficult-to-control divot region. In this manner, the threshold voltage of the subsequently formed gate may be more accurately controlled. As can be seen in FIG. 8, the nitride liner material still lies at the bottom of the shallow trench isolation structure 200. The presence of this nitride liner advantageously prevents unwanted oxidation of the underlying collar oxide of the capacitor, as mentioned earlier. Accordingly, although the nitride liner 114 is recessed to a greater extent than in the prior art, this recess is highly controlled and does not impact the retention time of the capacitor formed below the shallow trench isolation structure.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications, permutations and equivalents may be resorted to as falling within the scope of the invention.

What is claimed is:

1. A shallow trench isolation structure in a substrate, said shallow trench isolation structure comprising:
a trench in said substrate;
a nitride liner recessed within said trench and the nitride liner forming a partially enclosed volume, said partially enclosed volume being completely filled with a dielectric material which also completely fills the trench;
wherein said nitride liner is recessed such that an uppermost surface of said nitride liner is recessed to a first depth that is greater than a transistor channel depth, Dc, of a transistor that is disposed in a well beside said shallow trench isolation structure, the recessed nitride liner being dimensioned and configured to prevent hot carrier effects due to charge trapping for charge which traverses a channel of the transistor;

the dielectric material including an oxide disposed above said nitride liner such that said oxide extends above the uppermost surface of said nitride liner to substantially a top surface of said substrate, such that substantially no polysilicon material is disposed within the trench.

2. A shallow trench isolation structure as recited in claim 1, wherein said transistor is a P-FET transistor.

3. A shallow trench isolation structure in a substrate as recited in claim 1, wherein the uppermost surface of said nitride liner is recessed to a first depth that is greater than about 1000 angstroms below a top surface of said substrate.

4. A shallow trench isolation structure in a substrate as recited in claim 1, further comprising:

an oxide layer disposed within the trench, said oxide layer underlying said nitride liner; and an oxide fill disposed above said nitride liner such that the nitride liner is encapsulated by the oxide fill and oxide layer.

5. A shallow trench isolation structure in a substrate as recited in claim 4, wherein the oxide fill extends above said uppermost surface of said nitride liner, substantially to a top surface of said substrate, such that substantially no void exists above said uppermost surface of said nitride liner.

6. A shallow trench isolation structure in a substrate as recited in claim 4, wherein the oxide fill includes tetraethylorthosilicate.

7. A shallow trench isolation structure for preventing hot carrier effects due to charge trapping, said shallow trench isolation structure comprising:

a trench in the substrate;

an oxide liner formed lining the trench and a top surface of the substrate;

a nitride liner recessed within said trench and the nitride liner forming a partially enclosed volume, said partially enclosed volume being completely filled with a dielectric material which also completely fills the trench;

wherein said nitride liner is recessed such that an uppermost surface of said nitride liner is recessed to a first depth that is greater than a transistor channel depth, Dc, of a transistor that is disposed in a well beside said shallow trench isolation structure, the recessed nitride liner being dimensioned and configured to prevent hot carrier effects due to charge trapping for charge which traverses a channel of the transistor;

an oxide fill disposed above said nitride liner, such that said oxide fill extends above and below the uppermost surface of said nitride liner substantially to a top surface of said substrate and completely filling below the uppermost surface, respectively; and the oxide fill is disposed above said nitride liner such that polysilicon material used in other processing is prevented from entering the trench.

8. The structure of claim 7, wherein the oxide fill includes tetraethyorthosilicate.

* * * * *